US010026750B1

(12) United States Patent
Lai et al.

(10) Patent No.: US 10,026,750 B1
(45) Date of Patent: Jul. 17, 2018

(54) MEMORY DEVICE AND METHOD FOR OPERATING THE SAME

(71) Applicant: MACRONIX INTERNATIONAL CO., LTD., Hsinchu (TW)

(72) Inventors: Erh-Kun Lai, Taichung (TW); Hsiang-Lan Lung, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/806,569

(22) Filed: Nov. 8, 2017

(51) Int. Cl.
| | |
|---|---|
| *G11C 16/04* | (2006.01) |
| *H01L 27/11582* | (2017.01) |
| *H01L 27/11573* | (2017.01) |
| *H01L 29/06* | (2006.01) |
| *H01L 29/10* | (2006.01) |
| *H01L 29/417* | (2006.01) |

(Continued)

(52) U.S. Cl.
CPC .... *H01L 27/11582* (2013.01); *G11C 16/0466* (2013.01); *G11C 16/10* (2013.01); *G11C 16/14* (2013.01); *G11C 16/26* (2013.01); *H01L 23/535* (2013.01); *H01L 27/11568* (2013.01); *H01L 27/11573* (2013.01); *H01L 29/0649* (2013.01); *H01L 29/1037* (2013.01); *H01L 29/41741* (2013.01); *H01L 29/513* (2013.01); *H01L 29/518* (2013.01); *H01L 29/7926* (2013.01)

(58) Field of Classification Search
CPC ....... G11C 16/0483; G11C 16/06; G11C 8/16; G11C 11/56
See application file for complete search history.

(56) References Cited

U.S. PATENT DOCUMENTS 6,462,373 B2 * 10/2002 Shimizu ............... H01L 27/115
257/314
7,728,378 B2 * 6/2010 Ueda ................. G11C 16/0433
257/319

(Continued)

OTHER PUBLICATIONS

Parat, et al.: "A Floating Gate Based 3D NAND Technology With CMOS Under Array"; 978-1-4673-9894-7/15/$31.00 © 2015 IEEE; pp. 3.3.1-3.3.4.

(Continued)

*Primary Examiner* — Tuan T Nguyen
(74) *Attorney, Agent, or Firm* — McClure, Qualey & Rodack, LLP

(57) ABSTRACT

A memory device includes a peripheral circuit portion and an array portion disposed on the peripheral circuit portion. The array portion includes a bottom conductive layer; an isolation layer disposed on the bottom conductive layer; a semiconductor substrate disposed on the isolation layer; a channel layer disposed on a sidewall of a first through opening which exposes the semiconductor substrate and electrically contacting the semiconductor substrate; a memory layer; and a multilayers stack disposed on the semiconductor substrate. The multilayers stack includes a first insulating layer disposed on the semiconductor substrate; a first conductive layer disposed on the first insulating layer; second insulating layers disposed over the first insulating layer; and second conductive layers alternatively stacked with the second insulating layers and insulated from the first conductive layer. The memory layer is disposed between the channel and first conductive layers, and between the channel and second conductive layers.

17 Claims, 3 Drawing Sheets

(51) Int. Cl.
*H01L 23/535* (2006.01)
*H01L 29/792* (2006.01)
*G11C 16/10* (2006.01)
*G11C 16/26* (2006.01)
*G11C 16/14* (2006.01)
*H01L 27/11568* (2017.01)
*H01L 29/51* (2006.01)

(56) References Cited

U.S. PATENT DOCUMENTS

| | | | |
|---|---|---|---|
| 7,745,265 B2 | 6/2010 | Mokhlesi et al. | |
| 7,859,042 B2* | 12/2010 | Park | H01L 27/105 |
| | | | 257/315 |
| 8,680,520 B2 | 3/2014 | Yamazaki et al. | |
| 8,907,316 B2* | 12/2014 | Lung | G11C 13/0004 |
| | | | 257/4 |
| 9,136,153 B2 | 9/2015 | Or-Bach et al. | |
| 9,214,235 B2 | 12/2015 | Rhie | |
| 9,502,471 B1* | 11/2016 | Lu | H01L 27/2481 |
| 9,748,174 B1* | 8/2017 | Amano | H01L 23/53266 |
| 2012/0129301 A1* | 5/2012 | Or-Bach | H01L 21/6835 |
| | | | 257/E21.614 |
| 2013/0126957 A1* | 5/2013 | Higashitani | H01L 27/11519 |
| | | | 257/314 |
| 2016/0087055 A1 | 3/2016 | Cernea | |

OTHER PUBLICATIONS

Fukuzumi, et al.: "Optimal Integration and Characteristics of Vertical Array Devices for Ultra-High Density, Bit-Cost Scalable Flash Memory"; 1-4244-0439-X/07/$25.00 © 2007 IEEE; pp. 449-452.

* cited by examiner

MEMORY DEVICE AND METHOD FOR OPERATING THE SAME

BACKGROUND

Technical Field

The disclosure of the present invention generally relates to a non-volatile memory (NVM) device and the method for operating the same, and more particularly to a vertical channel memory and the method for operating the same.

Description of the Related Art

An NVM device which is able to continually store information even when the supply of electricity is removed from the device containing the NVM cell has been widespreadly adopted by bulk solid state memory applications in the art.

An NVM device having a vertical channel, such as a vertical channel NAND flash memory device, generally includes a semiconductor substrate, a multilayers stack configured by a plurality of insulating layers and a plurality of poly-silicon layers alternatively stacked with each other provided on the semiconductor substrate, a memory layer with silicon-oxide-nitride-oxide-silicon (SONOS) BE-SO-NOS or charge trapping memories structure and a poly-silicon channel layer formed in sequence on the sidewalls of a through hole/trench penetrating the multilayers stack; a plurality of memory cells defined at the intersection points formed by the memory layer, the channel layer and the poly-silicon layers; and the memory cells are electrically connected to the semiconductor substrate that can serve as a bottom common source line for performing a block erase operation of the NVM device through the channel layer.

However, since the substrate of traditional NVM device can serves as a bottom common source line, the bottom common source line typically has a doped region with rather high resistance formed in the semiconductor substrate, and parasitic junction may occur between the doped region and the semiconductor substrate, thus the power consumption may be increased, and the program/read operation reliability and device speed may be deteriorated by signal interference and RC delay due to the parasitic junction capacitance. In addition, since the substrate of traditional NVM device can be a silicon substrate, an array portion and a peripheral circuit portion of the traditional NVM device may be arranged side by side on a same plane, the chip area is still too large.

Therefore, there is a need of providing a memory device to obviate the drawbacks encountered from the prior art.

SUMMARY

One aspect of the present invention is to provide a memory device according to one embodiment of the present application, wherein the memory device includes a peripheral circuit portion and an array portion disposed on the peripheral circuit portion. The array portion includes a bottom conductive layer; an isolation layer disposed on the bottom conductive layer; a semiconductor substrate disposed on the isolation layer; and a multilayers stack disposed on the semiconductor substrate. The bottom conductive layer and the semiconductor layer are electrically insulated by the isolation layer. The multilayers stack includes a first insulating layer disposed on the semiconductor substrate; a first conductive layer disposed on the first insulating layer; second insulating layers disposed over the first insulating layer; and second conductive layers alternatively stacked with the second insulating layers and insulated from the first conductive layer; a channel layer disposed on a sidewall of a first through opening and electrically contacting the semiconductor substrate; and a memory layer disposed between the channel layer and the first conductive layer, and between the channel layer and the second conductive layers. The first through opening passes through the multilayers stack to expose the semiconductor substrate.

In accordance with another aspect of the present invention, a method for operating the memory device according to one embodiment of the present application is provided, wherein the method includes adjusting an electrical character of the semiconductor substrate by controlling an electrical potential of the bottom conductive layer, wherein the selected operation is program, read or erase.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION

Figure 1:
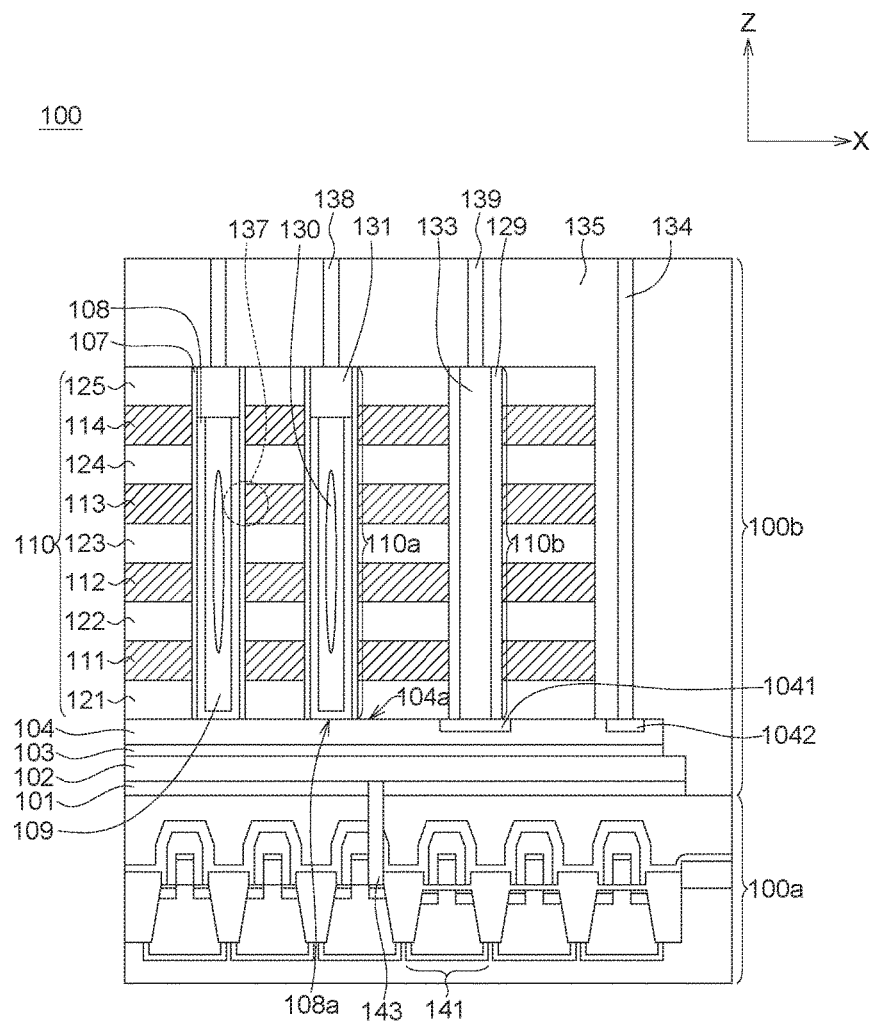
FIG. 1 is a cross-sectional view illustrating a memory device in accordance with one embodiment of the present invention.

The embodiments as illustrated below provide a memory device and the method for operating the same to solve the problems of large chip area and operation reliability due to the high resistance formed in the bottom common source line and bottom substrate. The present invention will now be described more specifically with reference to the following embodiments illustrating the structure and method for operating the memory device.

It is to be noted that the following descriptions of preferred embodiments of this invention are presented herein for purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present invention. In addition, the illustrations may not be necessarily drawn to scale, and the identical elements of the embodiments are designated with the same reference numerals.

FIG. 1 is a cross-sectional view illustrating a memory device 100 in accordance with one embodiment of the present invention. In the present embodiment, the memory device 100 is a vertical channel flash memory device.

Referring to FIG. 1, the memory device 100 may include a peripheral circuit portion 100a and an array portion 100b disposed on the peripheral circuit portion 100a. The peripheral circuit portion 100a may include a CMOS (Complementary Metal-Oxide-Semiconductor) structure 141. The array portion 100b may include a bottom conductive layer 102, an isolation layer 103 disposed on the bottom conductive layer 102, a semiconductor substrate 104 disposed on the isolation layer 103, a multilayers stack 110 provided on the semiconductor substrate 104. A dielectric layer 101 may be disposed between the bottom conductive layer 102 and peripheral circuit portion 100a. The dielectric layer 101 could be 0-2000 Å. The dielectric layer 101 is optional. Since there is an interlayer dielectric layer (ILD layer) (i.e. the dielectric layer 101) on the peripheral circuit portion 100a, the bottom conductive layer 102 will not short to bottom CMOS. The bottom conductive layer 102 may have a length equal to or larger than that of the semiconductor substrate 104. That is, an end of the bottom conductive layer 102 may be aligned with an end of the semiconductor substrate 104, or an end of the bottom conductive layer 102 may exceed an end of the semiconductor substrate 104.

In some embodiments of the present invention, the dielectric layer 101 may be made of dielectric material, such as silicon oxide, silicon nitride (SiN), silicon oxynitride (SiON), silicate or the arbitrary combinations thereof. The bottom conductive layer 102 may be made of conductive material, such as poly-silicon, p-type or n-type doped semiconductor material, metal or the arbitrary combinations thereof. The isolation layer 103 may be made of dielectric material, such as silicon oxide, silicon nitride (SiN), silicon oxynitride (SiON), high-K materials, silicate or the arbitrary combinations thereof. The semiconductor substrate 104 may be made of a p-type doped, n-type doped or undoped semiconductor material, such as poly-silicon, germanium (Ge) or any other suitable semiconductor material. In the present embodiment, the semiconductor substrate 104 is made of a lightly p-type doped poly-silicon or undoped polysilicon. In some embodiments of the present invention, the bottom conductive layer 102, the isolation layer 103, and the semiconductor substrate 104 can be formed by low pressure chemical vapor deposition (LPCVD). If the bottom conductive layer 102 is polysilicon (N+ or P+), the isolation layer 103 could be formed by oxidizing the bottom conductive layer 102 to form an oxide layer.

The multilayers stack 110 may include a first insulating layer 121, a first conductive layer 111 disposed on the first insulating layer 121, a plurality of second insulating layers 122-125, and a plurality of second conductive layers 112-114 alternatively stacked with the second insulating layers 122-125. The first insulating layer 121, the first conductive layer 111, the second insulating layers 122-125 and the second conductive layers 112-114 are parallel to each other and alternatively stacked on the semiconductor substrate 104 along the Z axle as shown in FIG. 1. In the present embodiment, the first insulating layer 121 and the second insulating layer 125 respectively serve as the bottommost layer and the top-most layer of the multilayers stack 110, wherein the first insulating layer 121 is directly in contact with the semiconductor substrate 104 and electrically isolates the semiconductor substrate 104 from the first conductive layer 111. The first through opening 110a penetrates through the multilayer stack 110 and exposes a portion of the semiconductor substrate 104. In some embodiments of the present invention, the first conductive layer 111 and the second conductive layers 112-114 may be made by poly-silicon, metal or other suitable conductive material and high k material. In the present embodiment, the first conductive layer 111 and the second conductive layers 112-114 are made of metal layers, such as TiN/W, TaN/W, TaN/Cu and so on, and the high k material layers, such as $Al_2O_3$, $HfO_2$, $ZrO_2$ and so on. The material of the first conductive layer 111 and the material of the second conductive layers 112-114 may be the same.

In some embodiments of the present invention, the first insulating layer 121, and the second insulating layers 122-125 may be made of dielectric material, such as silicon oxide, SiN, SiON, silicate or the arbitrary combinations thereof. In the present embodiment, the first insulating layer 121, and the second insulating layers 122-125 are made of silicon oxide. The material of the first insulating layer 121 and the material of the second insulating layers 122-125 may be the same. In some embodiments of the present invention, the first insulating layer 121, the second insulating layers 122-125, the first conductive layer 111, the second conductive layers 112-114 can be formed by low pressure chemical vapor deposition (LPCVD).

In the present embodiment, the bottom conductive layer 102 may has a thickness of typical 400-600 Å or 200-2000 Å. The isolation layer 103 may have a thickness in a range of 20-500 Å, and preferably have a thickness in a range of 20-100 Å. The thickness of the semiconductor substrate 104 may be in a range of 200-2000 Å. The thickness of the insulating layer 121 may range from 50 Å to 500 Å, and preferably is about 200 Å.

In some embodiments of the present invention, the first through openings 110a may be formed by an etching process. The etching process can be an anisotropic etching process, such as a reactive ion etching (RIE) process, performed on the multilayers stack 110 using a patterned hard mask layer as an etching mask. The first through openings 110a may be a plurality of circular through holes passing through the multilayers stack 110 along the Z axle used to expose a portion of the semiconductor substrate 104 serving as the bottom of the through openings 110a and used to expose portions of the first insulating layer 121, the first conductive layer 111, the second conductive layer 112, and the second insulating layers 122-125 serving as the sidewalls of the first through openings 110a.

A channel layer 108 is disposed on at least one sidewall of at least one first through opening 110a and electrically contacts the semiconductor substrate 104. A memory layer 107 is disposed between the channel layer 108 and the first conductive layer 111 and between the channel layer 108 and the second conductive layers 112-114. In the present embodiment, a bottom surface 108a of the channel layer 108 is lower than a top surface 104a of the semiconductor substrate 104. However, it should be appreciated that the arrangements of the semiconductor substrate 104 and the channel layer 108 are not limited in this respect. There is no contact pad formed at the bottom of the first through opening 110a and contacting the semiconductor substrate 104, by, for example, a selective epitaxial growth (SEG) process, and the channel layer 108 can directly contact the semiconductor substrate 104.

In some embodiments of the present application, the memory layer 107 may be a composite layer having (but not limited to) oxide-nitride-oxide (ONO), oxide-nitride-oxide-nitride-oxide (ONONO) or oxide-nitride-oxide-nitride-oxide-nitride-oxide (ONONONO) structure formed on the sidewall of the first through openings 110a. The channel layer 108 can be made of semiconductor material, such as silicon (Si), Ge or other doped/undoped semiconductor material. In the present embodiment, the channel layer 108 is made of undoped poly-silicon.

A plurality of memory cells 137 can be defined at the points of intersection between the second conductive layers 112 and 113, the memory layer 107 and the channel layer 108, so as to form a memory cell array in the multilayers stack 110.

The memory device 100 may further include a dielectric material 109, such as silicon dioxide (SiO$_2$), at least one air gap 130 formed in the first through openings 110a, a bond pad 131 formed on the dielectric material 109 to form an electrical contact with the channel layer 108, at least one second through opening 110b passing through the multilayers stack 110, a dielectric spacer 129 formed on the sidewalls of the second through opening 110b, a metal plug 133 formed in the second through opening 110b, a dielectric filling 135 formed on the semiconductor substrate 104 and the multilayer stack 110, interconnection vias 138 and 139 respectively formed on the bond pad 131 and the metal plug 133, and a substrate connection 134 disposed on the semiconductor substrate 104.

The metal plug 133 electrically contacts to the semiconductor substrate 104 and electrically insulated from the first conductive layer 111 and the second conductive layers 112-114 by the dielectric spacer 129. The substrate connection 134 electrically contacts the semiconductor substrate 104 and electrically insulated from the first conductive layer 111 and the second conductive layers 112-114 by the dielectric filling 135. The semiconductor substrate 104 may include a first well 1041 and a second well 1042 doped with n-type or p-type dopant. The metal plug 133 and the substrate connection 134 may be disposed on and electrically contact the first well 1041 and the second well 1042, respectively. In the present embodiment, the first well 1041 is doped with n-type dopant (N$^+$ well), and the second well 1042 is doped with p-type dopant (P$^+$ well). In some embodiments of the present invention, the metal plug 133 can serve as the source line of the memory device 100; and the memory cells 137 defined by the first conductive layer 111, the second conductive layers 112-113, the memory layer 107 and the channel layer 108 of the memory cell array can be electrically coupled to a decoder, such as a row decoder or a column decoder (not shown), through the bit lines (not shown).

In one embodiment, a bottom gate connection 143 may be formed on the CMOS structure 141, so as to electrically contact the bottom conductive layer 102 with the CMOS structure 141. A voltage may be applied to the bottom conductive layer 102 through the bottom gate connection 143 from a source or a drain of the CMOS structure 141. The interconnection vias 138 and 139, the substrate connection 134 and the bottom gate connection 143 can be made of conductive materials.

Since the array portion 100b of the present application can be stacked on the peripheral circuit portion 100a, the area of the memory device can be reduced comparing to a comparative example having the array portion and the peripheral portion disposed side by side on a same plane. Further, since the memory device 100 of the present application already has the bottom conductive layer 102, it is not necessary to have a SEG process for improving erase function, the thermal budget can be decreased, and the method for forming the memory device 100 of the present application can be easier comparing to a comparative example having a SEC process.

Figure 2:
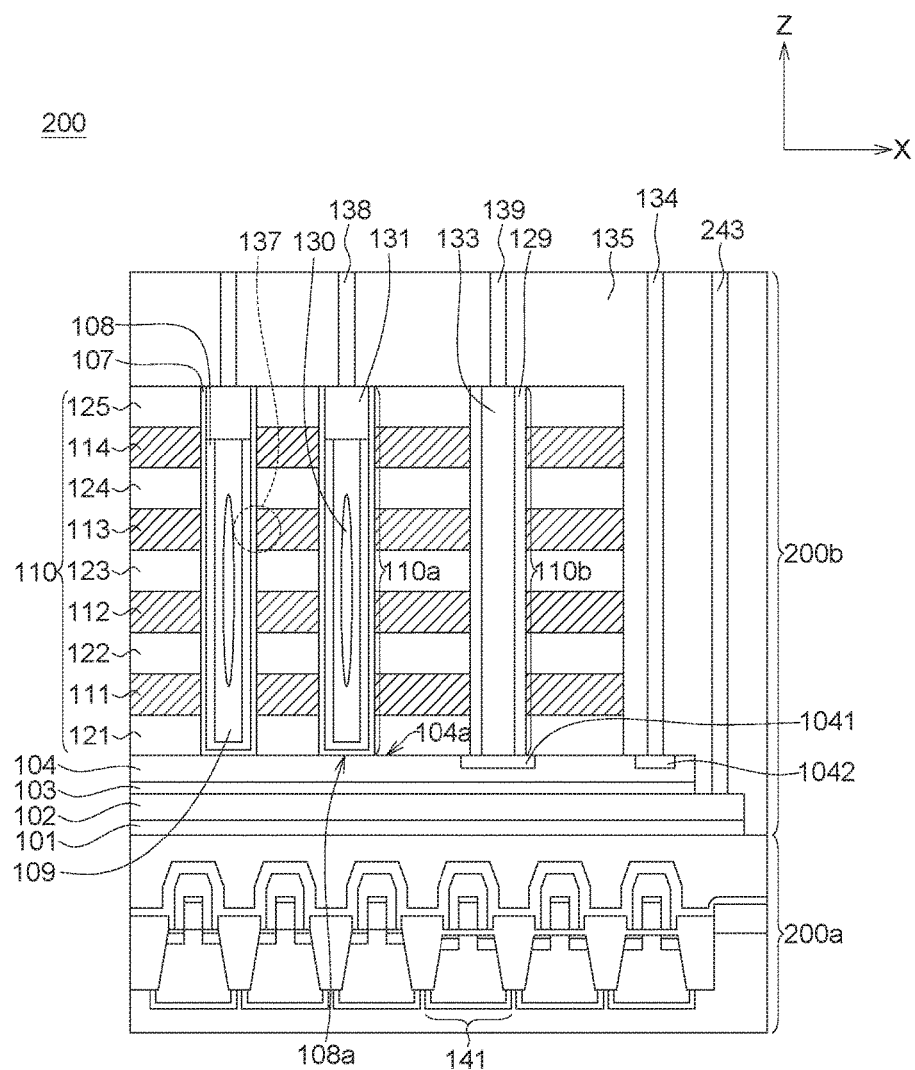
FIG. 2 is a cross-sectional view illustrating a memory device in accordance with another embodiment of the present invention.

FIG. 2 is a cross-sectional view illustrating a memory device 200 in accordance with another embodiment of the present invention. This embodiment is different from the embodiment shown in FIG. 1 in the bottom gate connection 243. Thus, the similarities may not be repeated here.

Referring to FIG. 2, the memory device 200 includes a peripheral circuitry portion 200a and an array portion 200b disposed on the peripheral circuitry portion 200a. The bottom gate connection 243 penetrates the dielectric filling 135 to electrically contact the bottom conductive layer 102. The bottom gate connection 243 may have a height larger than that of the multilayers stack 110. A voltage can be applied to the bottom conductive layer 102 through the bottom gate connection 243 disposed on the bottom conductive layer 102 from a power supply (not shown). In order to provide a landing area for the bottom gate connection 243, the bottom conductive layer 102 can have a length longer than that of the semiconductor substrate 104, and an end of the bottom conductive layer 102 exceeds an end of the semiconductor substrate 104.

The present application provides a method for operating the memory device, as shown in Table 1 below.

TABLE 1

|  | program | read | erase |
| --- | --- | --- | --- |
| selected BL | 0 | Vcc | floating |
| unselected BL | Vcc (inhibit) | 0 | floating |
| selected SSL | Vcc | Vcc | floating |
| unselected SSL | 0 | 0 | floating |
| WLn | Vpgm | Vref | 0 |
| WLn-1 | Vpass | Vpass | 0 |
| GSL | 0 | Vcc | floating |
| substrate connection | 0 | floating or 0 | 20 V |
| source line | 0 | 0 | floating |
| bottom gate | 0 | Vcc | -Vcc or floating |

The method for operating the memory device (such as memory device 100) may include adjusting an electrical character of the semiconductor substrate 104 by controlling an electrical potential of the bottom gate (such as bottom conductive layer 102) by a controller (not shown) according to a selected operation (such as program, read or erase). The controller may be implemented as a state machine determining the selected operation which should be program, read or erase.

In one embodiment, when the selected operation is "program," the voltage applied to a selected bit line (selected BL) may be 0V; the voltage applied to an unselected bit line (unselected BL) may be a positive logic supply voltage (Vcc) for inhibiting; the voltage applied to a selected string select line (selected SSL) may be a positive Vcc; the voltage applied to an unselected string select line (unselected SSL) may be 0V; the voltage applied to a word line (WLn, such as second conductive layer 113) electrically coupled to a target memory cell (such as memory cell 137) may be about 20V of Vpgm; the voltage applied to another word line (WLn-1, such as second conductive layer 112) may be about 8V of Vpass; the voltage applied to a ground select layer (GSL, such as first conductive layer 111) may be 0 V; the voltage applied to a substrate connection (such as substrate connection 134) may be 0V; the voltage applied to a source line (such as metal plug 133) may be 0V; the voltage applied to the bottom gate (such as bottom conductive layer 102) may be 0V.

When the selected operation is "read," the voltage applied to a selected BL may be, a positive Vcc; the voltage applied to an unselected BL may be 0V; the voltage applied to a selected SSL may be a positive Vcc; the voltage applied to an unselected SSL may be 0V; the voltage applied to a word line (WLn, such as second conductive layer 113) electrically coupled to a target memory cell (such as memory cell 137) may be Vref; the voltage applied to another word line (WLn−1, such as second conductive layer 112) may be Vpass; the voltage applied to a GSL (such as first conductive layer 111) may be a positive Vcc; the voltage applied to a substrate connection (such as substrate connection 134) may be 0V or the substrate connection may be floating; the voltage applied to a source line (such as metal plug 133) may be 0V; the voltage applied to the bottom gate (such as bottom conductive layer 102) may be a positive Vcc.

When the selected operation is "erase," the selected BL may be floating; the unselected BL may be floating; the selected SSL may be floating; the unselected SSL may be floating; the voltage applied to the word line (WLn, such as second conductive layer 113) electrically coupled to a target memory cell (such as memory cell 137) may be 0V; the voltage applied to another word line (WLn−1, such as second conductive layer 112) may be 0V; the GSL (such as first conductive layer 111) may be floating; the voltage applied to a substrate connection (such as substrate connection 134) may be 20V; the source line (such as metal plug 133) may be floating; the voltage applied to the bottom gate (such as bottom conductive layer 102) may be −Vcc or the bottom gate may be floating.

Figure 3A:
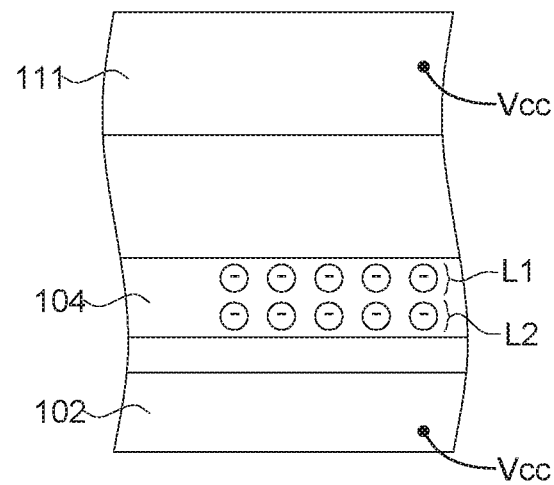
FIG. 3A is a partially enlarged view illustrating a memory device operated in read in accordance with one embodiment of the present invention.

FIG. 3A is a partially enlarged view illustrating a memory device operated in read in accordance with one embodiment of the present invention.

Referring to FIG. 3A, the selected operation of the memory device (such as memory device 100) is read. In the present embodiment, the semiconductor substrate 104 is a p-type doped substrate, a positive Vcc is applied to the first conductive layer 111 served as a GSL, and a positive Vcc is applied to the bottom conductive layer 102 served as a bottom gate. Since a first inversion layer L1 formed of electrons can be generated in the semiconductor substrate 104 by the first conductive layer 111, a second inversion layer L2 formed of electrons can be generated in the semiconductor substrate 104 by the bottom conductive layer 102, the double gate structure formed by the first conductive layer 111 and the bottom conductive layer 102 can enhance n+ inversion layer to reduce channel resistance, and the read speed of the memory device of the present disclosure can be faster comparing to a comparative example having no bottom conductive layer served as a bottom gate layer.

Figure 3B:
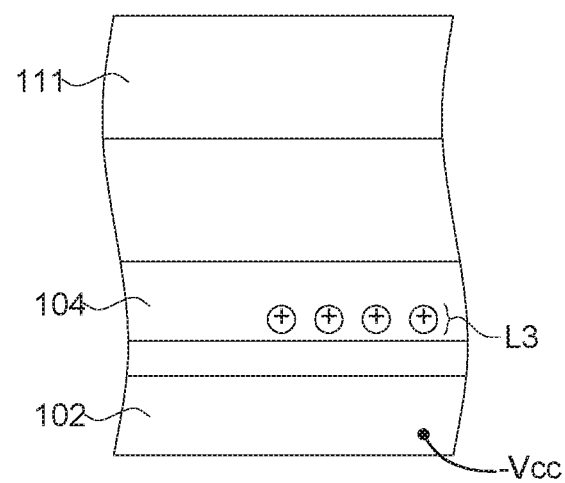
FIG. 3B is a partially enlarged view illustrating a memory device operated in erase in accordance with one embodiment of the present invention.

FIG. 3B is a partially enlarged view illustrating a memory device operated in erase in accordance with one embodiment of the present invention.

Referring to FIG. 3B, the selected operation of the memory device (such as memory device 100) is erase. In the present embodiment, the semiconductor substrate 104 is a p-type doped substrate, the first conductive layer 111 served as a GSL is floating, and a negative logic supply voltage (−Vcc) is applied to the bottom conductive layer 102 served as a bottom gate. The Vcc and −Vcc have different polar. A third inversion layer L3 formed of holes is generated by −Vcc applied to the bottom conductive layer 102, and is formed in the semiconductor substrate 104. Since −Vcc can be applied to the bottom conductive layer 102, the holes generated in the semiconductor substrate 104 can be increased, the p type dopant concentration in the semiconductor substrate 104 can be enhanced, and the erase speed of the memory device of the present disclosure can be faster comparing to a comparative example having no bottom conductive layer served as a bottom gate layer. The application of −Vcc to the bottom conductive layer 102 is optional. In some embodiments, the bottom conductive layer 102 can also be floating.

Further, since the bottom conductive layer 102 of the present disclosure can enhance the erase function, it is not necessary to perform a SEG process in the memory device for a better erase function. In other words, a high thermal budget caused by the SEG process can be decreased, and the method for forming the memory device of the present application can be easier comparing to a comparative example having a SEG process.

In a comparative example, a memory device may use N+ lower source line to serve as a substrate layer and bottom common source line to replace the silicon substrate, to reduce the signal interference due to the parasitic junction capacitance formed in the bottom common source line. In this way, it may use GIDL (gate induced drain leakage), which needs to generate hole current near a lower select gate layer to raise the body potential, for erase operation. However, the speed of using GIDL for erase operation with N+ lower source line is lower than that using substrate for erase operation, and GIDL may cause reliability degradation.

In the present application, since it is not necessary to use the GIDL for erase operation, the channel resistance can be lower than a comparative example using N+ lower source line to serve as a substrate layer and bottom common source line to replace the silicon substrate and using GIDL for erase operation. Further, since not much negative bias (such as −13V to −20V) have to be applied to a word line, a lot of charge pumping circuitry can be reduced.

In accordance with the aforementioned embodiments of the present invention, a memory device and method for operating the same are provided. The memory device includes a peripheral circuit portion and an array portion disposed on or overlapped with the peripheral circuit portion. The array portion includes a bottom conductive layer, an isolation layer disposed on the bottom conductive layer, a semiconductor substrate disposed on the isolation layer, a multilayers stack having a plurality of memory cells defined therein disposed on the semiconductor substrate; a plurality of channel layers vertically passing through the multilayers stack and contacting the semiconductor substrate provided to electrically connect the memory cells to form a plurality of memory cell strings.

Because the memory device provided by the embodiments of the present invention applies the semiconductor substrate made of doped poly-silicon, the peripheral circuit portion can be disposed under the array portion, and the peripheral circuit portion and the array portion can be stacked together. Thus, the chip area of the present disclosure can be largely reduced comparing to the comparative example that the peripheral circuit portion and the array portion can not be stacked together. Further, since the embodiments of the present invention applies the bottom conductive layer to improve the erase and read function, the electrical potential of the semiconductor substrate which serves as the bottom common source line not only can be controlled by the first conductive layer, but also by the bottom conductive layer. In other words, both of the bottom conductive layer and the first conductive layer can control the electrical characteristics of the semiconductor substrate. Thus, both of the erase and the read function can be enhanced, and the operation reliability and device speed of the memory device can be improved.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory device, comprising:
a peripheral circuit portion and an array portion disposed on the peripheral circuit portion, wherein the array portion comprises:
   a bottom conductive layer;
   an isolation layer, disposed on the bottom conductive layer;
   a semiconductor substrate, disposed on the isolation layer, wherein the bottom conductive layer and the semiconductor substrate are electrically insulated by the isolation layer;
   a multilayers stack, disposed on the semiconductor substrate, wherein the multilayers stack comprises:
      a first insulating layer, disposed on the semiconductor substrate;
      a first conductive layer, disposed on the first insulating layer;
      a plurality of second insulating layers, disposed over the first insulating layer; and
      a plurality of second conductive layers, alternatively stacked with the second insulating layers and insulated from the first conductive layer;
   a channel layer, disposed on at least one sidewall of at least one first through opening and electrically contacting the semiconductor substrate, wherein the first through opening passes through the multilayers stack, so as to expose the semiconductor substrate; and
   a memory layer, disposed between the channel layer and the first conductive layer, and between the channel layer and the second conductive layers.

2. The memory device according to claim 1, wherein the bottom conductive layer is poly-silicon, p-type or n-type doped semiconductor material, metal or the arbitrary combinations thereof.

3. The memory device according to claim 1, wherein the bottom conductive layer has a thickness in a range of 400-600 Å.

4. The memory device according to claim 1, wherein the semiconductor substrate is disposed between the bottom conductive layer and the first conductive layer.

5. The memory device according to claim 1, wherein the peripheral circuit portion further comprises a CMOS structure, and the CMOS structure is disposed under the semiconductor substrate and the bottom conductive layer.

6. The memory device according to claim 5, further comprising a bottom gate connection, wherein the bottom gate connection electrically contact the bottom conductive layer with the CMOS structure.

7. The memory device according to claim 1, wherein the memory layer comprises an oxide-nitride-oxide (ONO) structure disposed on the sidewall of the first through opening and between the second conductive layers and the channel layer.

8. The memory device according to claim 1, further comprising:
   a dielectric spacer disposed on the sidewall of a second through opening, wherein the second through opening passes through the multilayers stack, so as to expose the semiconductor substrate;
   a metal plug, disposed in the second through opening, electrically in contact with the semiconductor substrate and electrically insulated from the first conductive layer and the second conductive layers by the dielectric spacer;
   a dielectric material filled into the first through opening in which at least one air gap is formed; and
   a bond pad disposed on the dielectric material.

9. The memory device according to claim 1, further comprising a substrate connection disposed on the semiconductor substrate.

10. The memory device according to claim 1, further comprising a bottom gate connection disposed on the bottom conductive layer, wherein the bottom gate connection has a height larger than that of the multilayers stack.

11. A method for operating the memory device according to claim 1, comprising:
   adjusting an electrical character of the semiconductor substrate by controlling an electrical potential of the bottom conductive layer, wherein the selected operation is program, read or erase.

12. The method according to claim 11, wherein the selected operation is program, and the step of adjusting the electrical character of the semiconductor substrate further comprises:
   applying a voltage of 0V to the bottom conductive layer; and
   applying a voltage of 0V to the first conductive layer.

13. The method according to claim 11, wherein the selected operation is read, and the step of adjusting the electrical character of the semiconductor substrate further comprises:
   applying a first positive logic supply voltage to the bottom conductive layer; and
   applying a second positive logic supply voltage to the first conductive layer.

14. The method according to claim 11, wherein after respectively applying the first positive logic voltage and the second positive logic voltage to the bottom conductive layer and the first conductive layer, a first inversion layer and a second inversion layer are formed in the semiconductor substrate, and the first inversion layer and the second inversion layer are formed of electrons.

15. The method according to claim 11, wherein the selected operation is erase, and the step of adjusting the electrical character of the semiconductor substrate further comprises:
   applying a negative logic supply voltage to the bottom conductive layer; and
   making the first conductive layer to be floating.

16. The method according to claim 15, wherein after applying the negative logic supply voltage to the bottom conductive layer, an inversion layer is formed in the semiconductor substrate, and the inversion layer is formed of holes.

17. The method according to claim 11, wherein the selected operation is erase, and the step of adjusting the electrical character of the semiconductor substrate further comprises:
   making the bottom conductive layer to be floating; and
   making the first conductive layer to be floating.

* * * * *